United States Patent [19]
Merhar

[11] 3,987,320
[45] Oct. 19, 1976

[54] MULTIAXIS PIEZOELECTRIC SENSOR

[75] Inventor: Donald M. Merhar, Excelsior, Minn.

[73] Assignee: The United States of America as represented by the Secretary of the Army, Washington, D.C.

[22] Filed: July 30, 1975

[21] Appl. No.: 600,348

Related U.S. Application Data

[63] Continuation of Ser. No. 430,138, Jan. 2, 1974, abandoned.

[52] U.S. Cl. .................... 310/8.4; 310/9.6; 73/DIG. 4; 340/17 R

[51] Int. Cl.[2] .................... H01L 41/04

[58] Field of Search .................... 310/8.3, 8.6, 8.4, 9.1, 310/9.4, 9.8, 9.6; 340/10, 17; 73/516 R, 516 LM, 517 R, 517 AV, 517 A, DIG. 4

[56] References Cited

UNITED STATES PATENTS

| | | | |
|---|---|---|---|
| 3,147,391 | 9/1964 | Darrel et al. | 310/8.6 UX |
| 3,187,300 | 6/1965 | Brate | 310/8.6 UX |
| 3,374,663 | 3/1968 | Morris | 310/8.4 X |
| 3,461,730 | 8/1969 | Peters | 310/8.4 X |
| 3,893,342 | 7/1975 | Florian | 310/8.4 X |
| 3,911,388 | 10/1975 | Crump et al. | 310/8.4 X |

*Primary Examiner*—Mark O. Budd
*Attorney, Agent, or Firm*—Nathan Edelberg; A. Victor Erkkila; Thomas R. Webb

[57] ABSTRACT

A multiaxis transducer including a spherical conductive core, surrounded by a pair of piezoelectric hemispheres which are insulated from one another except at contact with the core. The piezoelectric hemispheres are surrounded by a pair of conductive hemispheres which are insulated from each other and are positioned to compress the piezoelectric hemispheres between the conductive hemispheres and the core so as to permit generation of electrical signals by the piezoelectric material through either compression or release of compression. Also included are means for receiving electrical signals generated by the piezoelectric hemispheres during application of acceleration force towards one of the conductive hemispheres.

3 Claims, 1 Drawing Figure

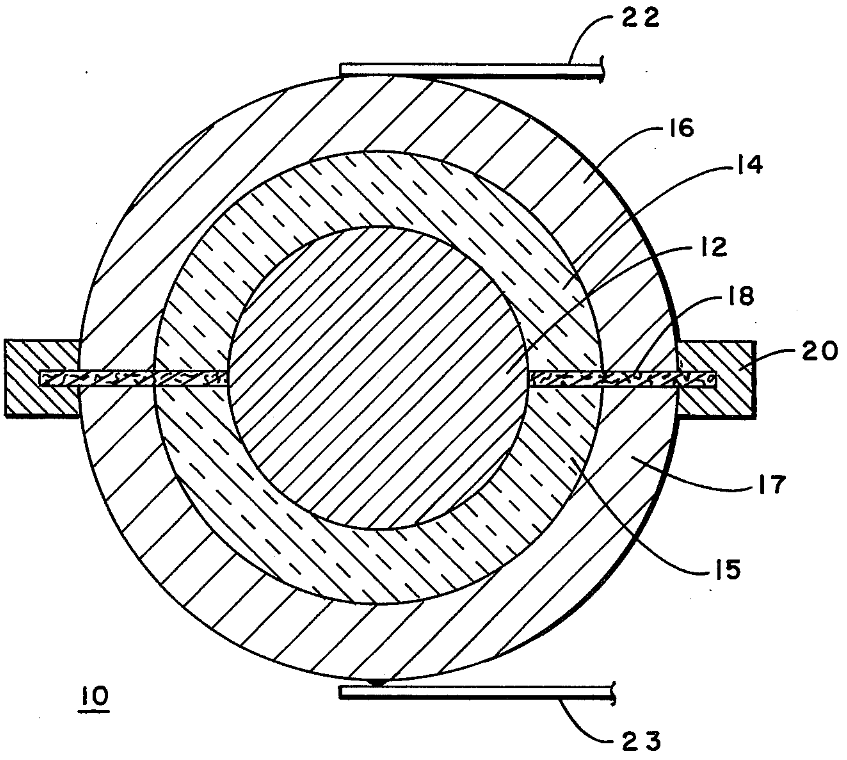
22
16
14
12
18
20
17
15
10
23

MULTIAXIS PIEZOELECTRIC SENSOR

This is a continuation of application Ser. No. 430,138, filed Jan. 2, 1974, now abandoned.

BACKGROUND OF THE INVENTION

The purpose of a transducer generally is to transform motion, activated mechanically, into electrical or electronic signals, which are then put to use in some form. Piezoelectric materials have been known generally to be useful in detecting motion such as acceleration of a mass, and to convert this motion into an electrical signal. U.S. Pat. No. 3,400,284 generally describes a piezoelectric accelerometer, in which piezoelectric materials are compressed to generate electrical signals in response to acceleration in a given direction, based upon the design of the device.

U.S. Pat. No. 3,701,903 adapts a piezoelectric material to react along a sensitive axis, with circuit limitations to eliminate minor changes in the mass.

The application of such a transducer used for detection of mechanical movement such as acceleration has also been applied in devices which detect motion in more than one direction. For example, U.S. Pat. No. 3,006,280 describes the application of piezoelectric transducers to fuses and provides a plurality of single direction sensors lined up in different axes in an attempt to activate a fuse for a projectile or a mine when such a device is struck or collides with another object.

None of the prior devices are truly omnidirectional in activity and are generally incapable of detecting minor seismic forces which are desired to be converted to electrical signals.

OBJECTS OF THE INVENTION

Accordingly, it is an object of this invention to provide a generally multiaxis seismic sensor, and particularly one which is capable of operation without an outside source of power.

It is a further object of this invention to be able to detect seismic acceleration after random placement of the detecting device without concern for its position of placement.

Another object of this invention is to provide a device which may be attached to objects which are being monitored with the ability to be sensitive without regard to change in movement of the object being monitored.

Yet another object of this invention is to provide a low cost piezoelectric transducer which is sensitive to minor seismic forces and which is capable of surviving shock such as being fired from a gun, taking advantage of both compressing and expanding the piezoelectric material in a manner such that the signals are additive. Other objects will appear hereinafter.

BRIEF SUMMARY OF THE INVENTION

It has now been discovered that the above and other objects of this invention can be accomplished in the following manner. Basically, the invention consists of a multiaxis transducer. This transducer includes a spherical conductive core surrounded by a pair of piezoelectric hemispheres with means for insulating the piezoelectric hemispheres from each other except at contact with the core. The piezoelectric hemispheres are in turn surrounded by a pair of conductive hemispheres and include means for insulating the conductive hemispheres from each other. The conductive hemispheres are compressed against the piezoelectric hemispheres to thereby create stress in the piezoelectric material, between the core and the conductive hemispheres. Finally, means are provided for receiving electrical signals generated by compression of one of the piezoelectric hemispheres (along with resulting expansion of the other piezoelectric hemisphere) during application of force towards one of the conductive hemispheres.

BRIEF DESCRIPTION OF THE DRAWING

The drawing represents a schematic, sectioned view of one embodiment of the present invention.

DESCRIPTION OF THE PREFERRED EMBODIMENT

Referring to the drawing, the piezoelectric device shown generally by the reference numeral 10 contains a spherical conductive core 12, which is surrounded by a pair of piezoelectric hemispheres 14 and 15. Insulation 18 separates and insulates the hemispheres 14 and 15 from each other and permits electrical contact only through the core 12. The hemispheres 14 and 15 are constructed from conventional piezoelectric materials, such as by taking crushed piezoelectric particles and molding them with a binder such as rubber into hemispheres suitable in size and shape for use in this device. Typical examples of piezoelectric materials are those which have a principle constituent selected from binary systems such as lead titanate-lead zirconate or lead titanate-lead stanate, as well as the ternary system employing lead zirconate-lead titanate-lead stanate. Other piezoelectric materials are equally useful in the present invention.

The piezoelectric hemispheres 14 and 15 are in turn surrounded by conductive hemispheres 16 and 17, which may be made from metal which is noncorrosive and conductive. Insulator 18 also separates the conductive hemispheres 16 and 17. These hemispheres 16 and 17 are designed so that they are capable of compressing the piezoelectric hemispheres 14 and 15 against the core 12. By passing a current through the piezoelectric material, otherwise known as poling or polorizing the at rest state provides a neutrally charged device. Hemisphere 14 is poled from core 12 to hemisphere 16. Hemisphere 15 is poled from core 12 to hemisphere 17. Clamps, 20, maintain the respective hemispheres in the proper position. Electrical contacts 22 and 23 are provided to receive the charge generated by application of force towards one of the conductive hemispheres 16 or 17, based upon the equation: Charge Q equals Capacitance C times Voltage V.

In operation, the device receives a seismic shock or acceleration in any particular direction chosen. The result of this shock is to move the conductive spherical core 12 in a direction towards the source of force. Movement of the pressure on the core 12 in the direction towards that source causes that core to compress one of the piezoelectric hemispheres, for example, hemisphere 14. Simultaneously, this compression of hemisphere 14 causes an expansion of previously compressed hemisphere 15. At that time, a voltage is generated by the pressure on the piezoelectric hemispheres tending to cause current to be passed from core 12 through the hemisphere 14 to conductive hemisphere 16 and on through the electrical lead 22. Simultaneously, the voltage generated by relaxation of hemisphere 15 tends to cause a flow of current into the device through electrical contact 23, conductive hemisphere 17 and piezoelectric hemispheres 15 to core 12. Consequently, upon application of acceleration to the center core 12, an electrical signal voltage is generated at terminals 22 and 23, which is the sum of these two voltages, thereby signifying the application of such an acceleration.

This signal voltage may be used for any number of purposes, such as to activate an alarm, signal the happening of an event, such as ignition of an explosive, or cause some other electronic device, such as a timer to begin operation. The device is sensitive to small seismic shock, yet is rugged enough to be fired from a gun for placement.

Having thus described the invention, what is claimed is:

1. A multiaxis transducer, comprising:

a spherical conductive core;

a pair of piezoelectric hemispheres surrounding and contacting said core, said piezoelectric hemispheres being similarly poled in radial directions;

means for electrically insulating said piezoelectric hemispheres from each other except through contact with said core;

a pair of conductive hemispheres, each being in contact with one of said piezoelectric hemispheres;

means for electrically insulating said conductive hemispheres from each other;

means for maintaining said piezoelectric hemispheres in compression between said core and said conductive hemispheres to maintain a radial voltage across said hemispheres; and a pair of terminals each connected to one of said conductive hemispheres for receiving a signal voltage generated by compression of one of said piezoelectric hemispheres and by expansion of the other piezoelectric hemisphere during application of force to one of said conductive hemispheres.

2. The transducer of claim 1, wherein said piezoelectric hemispheres are molded crushed piezoelectric crystals held together with a binder.

3. The transducer of claim 1, wherein said piezoelectric hemispheres are poled from the core to their respective conductive hemispheres, whereby said signal voltage is such as to tend to cause electric current to pass through said piezoelectric hemispheres in the direction towards the source of said force.

* * * * *